(12) United States Patent
Lyons

(10) Patent No.: US 8,390,782 B2
(45) Date of Patent: Mar. 5, 2013

(54) MULTI NOZZLE PROXIMITY SENSOR EMPLOYING COMMON SENSING AND NOZZLE SHAPING

(75) Inventor: Joseph H. Lyons, Wilton, CT (US)

(73) Assignee: ASML Holding N.V., Veldhoven (NL)

( * ) Notice: Subject to any disclaimer, the term of this patent is extended or adjusted under 35 U.S.C. 154(b) by 739 days.

(21) Appl. No.: 12/539,190

(22) Filed: Aug. 11, 2009

(65) Prior Publication Data

US 2010/0033705 A1    Feb. 11, 2010

Related U.S. Application Data

(60) Provisional application No. 61/087,902, filed on Aug. 11, 2008.

(51) Int. Cl.
 G01L 7/00   (2006.01)
 G03B 27/32  (2006.01)
 G03B 27/42  (2006.01)
 G03B 27/52  (2006.01)

(52) U.S. Cl. ............. 355/55; 73/706; 73/715; 355/53; 355/77

(58) Field of Classification Search .......... 73/37.5–37.9, 73/705–706, 715–731; 355/53, 55, 77
See application file for complete search history.

(56) References Cited

U.S. PATENT DOCUMENTS

| | | | |
|---|---|---|---|
| 4,550,592 A | 11/1985 | Dechape | |
| 4,953,388 A | 9/1990 | Barada | |
| 5,128,537 A * | 7/1992 | Halg | 250/231.19 |
| 5,933,215 A * | 8/1999 | Inoue et al. | 355/53 |
| 7,010,958 B2 | 3/2006 | Gajdeczko et al. | |
| 7,549,321 B2 | 6/2009 | Kochersperger et al. | |
| 2004/0118183 A1 * | 6/2004 | Gajdeczko et al. | 73/37.5 |
| 2005/0217384 A1 * | 10/2005 | Gajdeczko et al. | 73/716 |
| 2005/0241371 A1 * | 11/2005 | Carter et al. | 73/37.5 |
| 2005/0243500 A1 * | 11/2005 | Xie et al. | 361/503 |
| 2007/0074579 A1 * | 4/2007 | Cook et al. | 73/718 |

FOREIGN PATENT DOCUMENTS

| | | |
|---|---|---|
| JP | 56-111998 A | 9/1981 |
| JP | 62-231206 A | 10/1987 |
| JP | 63-009805 A | 1/1988 |
| JP | 2-097643 A | 4/1990 |
| JP | 6-507487 A | 8/1994 |
| JP | 7-135135 A | 5/1995 |
| JP | 10-154659 A | 6/1998 |
| JP | 2002-277384 A | 9/2002 |
| JP | 2004-198430 A | 7/2004 |

OTHER PUBLICATIONS

English-Language Translation of Notice of Reasons for Rejection directed to related Japanese Patent Application No. 2009-181211, mailed Jul. 26, 2011, the Japanese Patent Office; 6 pages.

* cited by examiner

*Primary Examiner* — Toan Ton
*Assistant Examiner* — Colin Kreutzer
(74) *Attorney, Agent, or Firm* — Sterne, Kessler, Goldstein & Fox P.L.L.C.

(57) ABSTRACT

A fluid proximity sensor having one or more measurement nozzles and a reference nozzle coupled to a common chamber. Diaphragms coupled to the measurement nozzles can be sensed by optical, capacitive or inductive means so as to detect changes in pressure. In addition, the number of pressure detectors can be minimized through the use of control valves to selectively couple the nozzles to the detectors, while maintaining the required high level of topographic sensitivity. Further, the measurement nozzle dimensions can be adjusted to optimize proximity measurements in response to accuracy, speed and similar requirements.

26 Claims, 7 Drawing Sheets

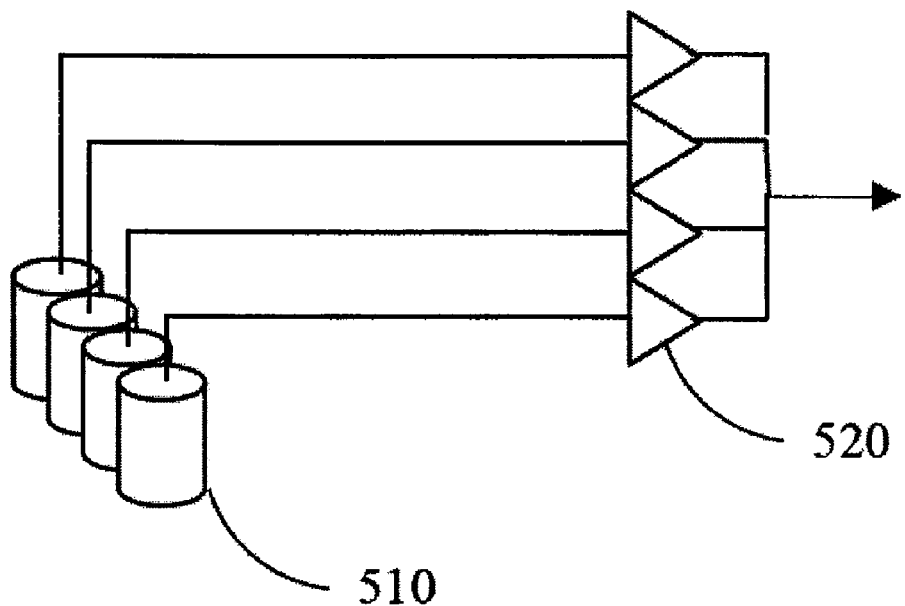
FIG. 5
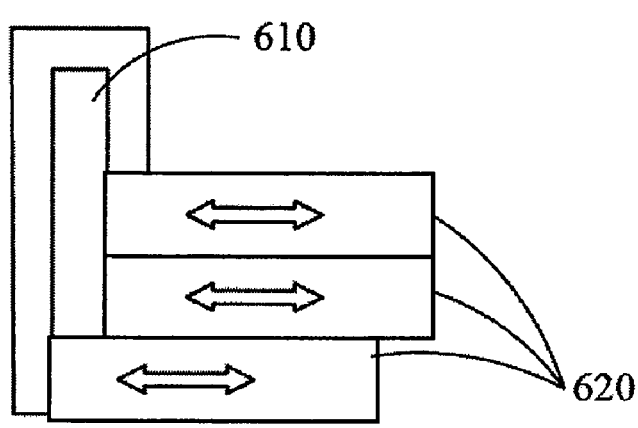        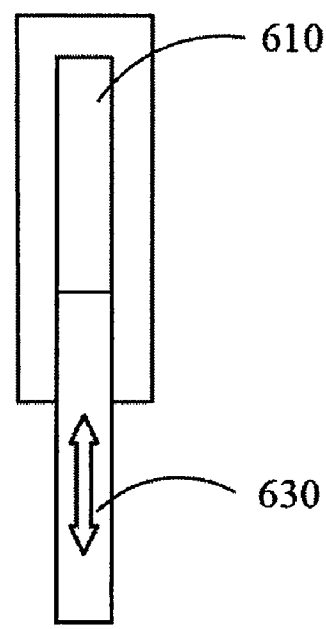
FIG. 6A                 FIG. 6B

MULTI NOZZLE PROXIMITY SENSOR EMPLOYING COMMON SENSING AND NOZZLE SHAPING

CROSS-REFERENCE TO RELATED APPLICATIONS

The present application claims the benefit under 35 U.S.C §119(e) of U.S. Provisional Patent Application No. 61/087,902, filed Aug. 11, 2008, which is incorporated herein by reference in its entirety.

BACKGROUND

1. Field

Embodiments of the present invention relate to a proximity sensor, and in particular to a proximity sensor for use in semiconductor lithographic applications.

2. Background

Many automated manufacturing processes require the sensing of the distance between a manufacturing tool and the product or material surface being worked upon. In some situations, such as semiconductor lithography, that distance must be measured with an accuracy approaching a nanometer.

The challenges associated with creating a proximity sensor of such accuracy are significant, particularly in the context of photolithography systems. In the photolithography context, in addition to the need to be non-intrusive as well as to precisely detect very small distances, the proximity sensor cannot introduce contaminants or come in contact with the work surface, typically a semiconductor wafer. Occurrence of either situation may significantly degrade or ruin the quality of the material surface or product being worked upon.

Different types of proximity sensors are available to measure very small distances. Examples of proximity sensors include capacitance gauges and optical gauges. These proximity sensors have serious shortcomings when used in lithographic projection systems because the physical properties of materials deposited on wafers may impact the precision of these sensors. For example, capacitance gauges, being dependent on the concentration of electric charges, can yield spurious proximity readings in locations where one type of material (e.g., metal) is concentrated. More generally, optical and capacitive methods are prone to errors due to significant interactions with layers beneath photoresist coatings. Another class of problems occurs when exotic wafers made of non-conductive and/or photosensitive materials, such as Gallium Arsenide (GaAs) and Indium Phosphide (InP), are used. In these cases, capacitance gauges and optical gauges may provide spurious results, and are therefore not optimal.

U.S. Pat. Nos. 4,953,388, 4,550,592, 7,010,958, and 7,549,321, all of which are incorporated herein by reference in their entireties, disclose an alternative approach to proximity sensing through the use of a fluid sensor. In this application, the use of the word "fluid" includes the use of either liquid or gas forms of a substance. A typical fluid sensor contains a reference nozzle and one or more measurement nozzles to emit a fluid flow onto reference and measurement surfaces. Measurements are made of the back pressure differences within the sensors to determine the distance between the measurement nozzle and the measurement surface. A fluid sensor is not vulnerable to concentrations of electric charges or to the electrical, optical or other physical properties of a wafer surface. A fluid sensor detects only the top physical layer, and thereby yields a superior result. Accordingly, these types of gauges are ideal for topographic measurement of a material surface, such as that used to establish focus prior to lithographic exposure.

Speed of measurement is a critical performance driver in current semiconductor manufacturing processes. Although adding multiple measurement nozzles to a proximity sensor increases its throughput, it carries a disadvantage in that such an addition adds complexity and cost. Moreover, high bandwidth of proximity sensors is also a critical requirement to support current semiconductor manufacturing practice.

In addition to speed and bandwidth as being some of the key requirements, proximity sensors typically operate at very small gaps between the wafers and the sensors. As such, these sensors are often attached to an extend-and-retract mechanism, the stability of which affects the error budget of the sensor measurement. Faced with an error budget challenge of the type described above, the conventional practice for this class of proximity sensor is to use a balanced bridge architecture to gain common mode rejection of these types of external environmental disturbances. Use of a balanced bridge adds to the cost and the complexity of the sensor.

Therefore, what is needed is an apparatus and method to provide an accurate proximity sensor with increased measurement speed possibilities while minimizing the cost and complexity of the sensor.

BRIEF SUMMARY

In one embodiment of the present invention, a fluid proximity sensor is provided that includes one or more measurement chambers, with each measurement chamber separated from a common reference chamber by a diaphragm. The measurement chamber(s) and the reference chamber are sourced from the same fluid supply, while each chamber vents through its own dedicated nozzle. In the case of the reference chamber, a fixed standoff is located proximal to, and opposite from, the reference nozzle. The proximity of the measurement nozzle(s) to the wafer surface affects the pressure in the measurement chamber(s), such that a pressure differential exists across the diaphragm(s). That pressure differential (and in turn the associated proximity) can be measured by sensing the movement of the diaphragm(s).

In a further embodiment of the present invention, remote sensing of the diaphragm(s) is provided. By providing a transparent window for each diaphragm, an external sensor can measure the movement of an associated internal diaphragm in response to the pressure differential. Different means of sensing are within the scope of the current invention, including optical, inductive and capacitive sensing. For each means of sensing, a window material is used that is transparent for the particular means of sensing.

In a further embodiment of the present invention, the fluid proximity sensor is mounted on a retractable mechanism in order to support proximity measurements commensurate with modern-day photolithography. By placing a reference surface on the retractable mechanism, the precise positioning of the proximity sensor can be maintained, and therefore accurate proximity measurements can be sustained, despite the potential for significant errors.

In a further embodiment of the present invention, an optimal proximal sensor architecture is provided that uses an adaptable nozzle aperture and/or multiple nozzles coupled to a common measurement chamber. By reducing the number of measurement chambers, a simplified more cost-effective proximity sensor is provided.

Further embodiments, features, and advantages of the invention, as well as the structure and operation of the various embodiments of the invention are described in detail below with reference to the accompanying drawings.

BRIEF DESCRIPTION OF THE DRAWINGS/FIGURES

Embodiments of the present invention are described with reference to the accompanying drawings. In the drawings, like reference numbers indicate identical or functionally similar elements.

FIGS. 1A and 1B respectively depict reflective and transmissive lithographic apparatuses.

FIG. 5 illustrates a schematic diagram whereby multiple samples can be obtained over the exposure field by employing switchable multiple ports connected to a common measurement chamber, according to an embodiment of the current invention.

FIGS. 6A and 6B illustrate an approach whereby adjustable nozzle port apertures can be used to yield multiple samples to yield a topographical map over the exposure field, according to embodiments of the current invention.

Figure 7:
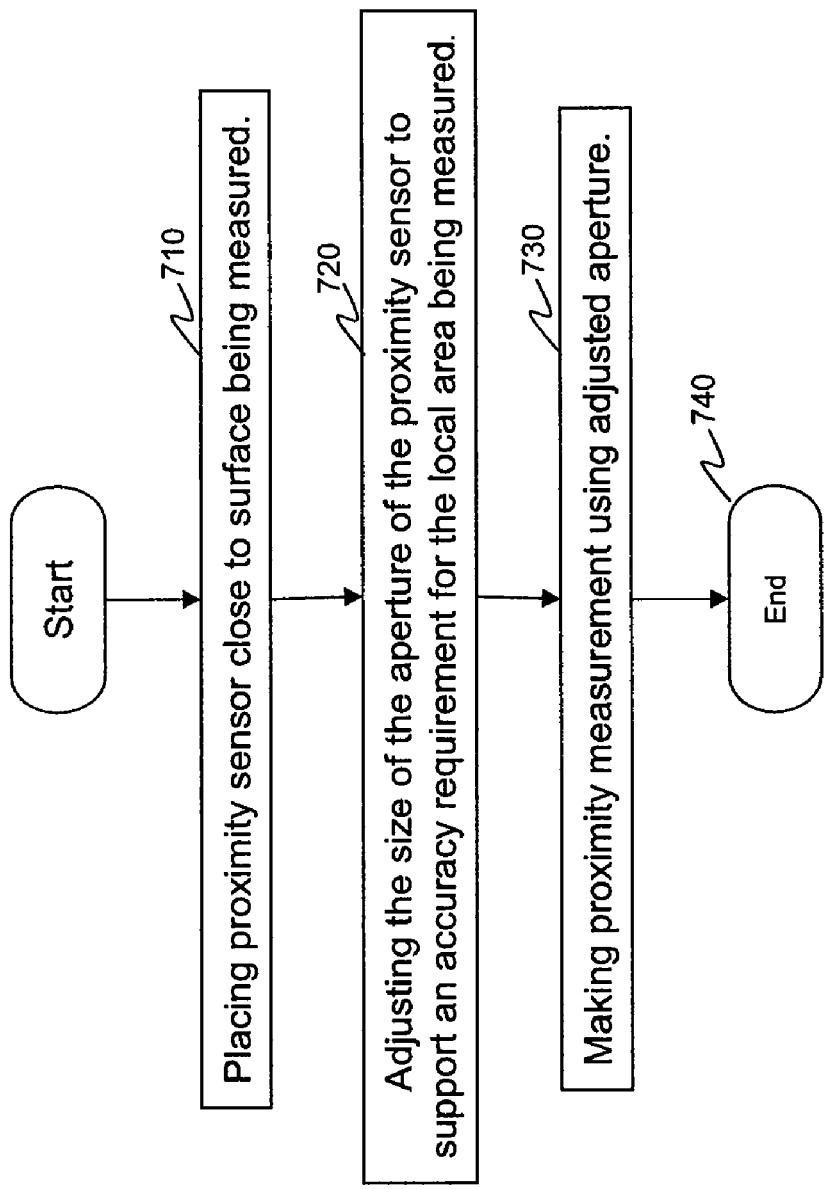

FIG. 7 provides a flowchart of a method that uses fluid flow through one or more adjustable apertures to perform proximity measurements on a material surface, according to an embodiment of the current invention.

DETAILED DESCRIPTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Figure 1A:
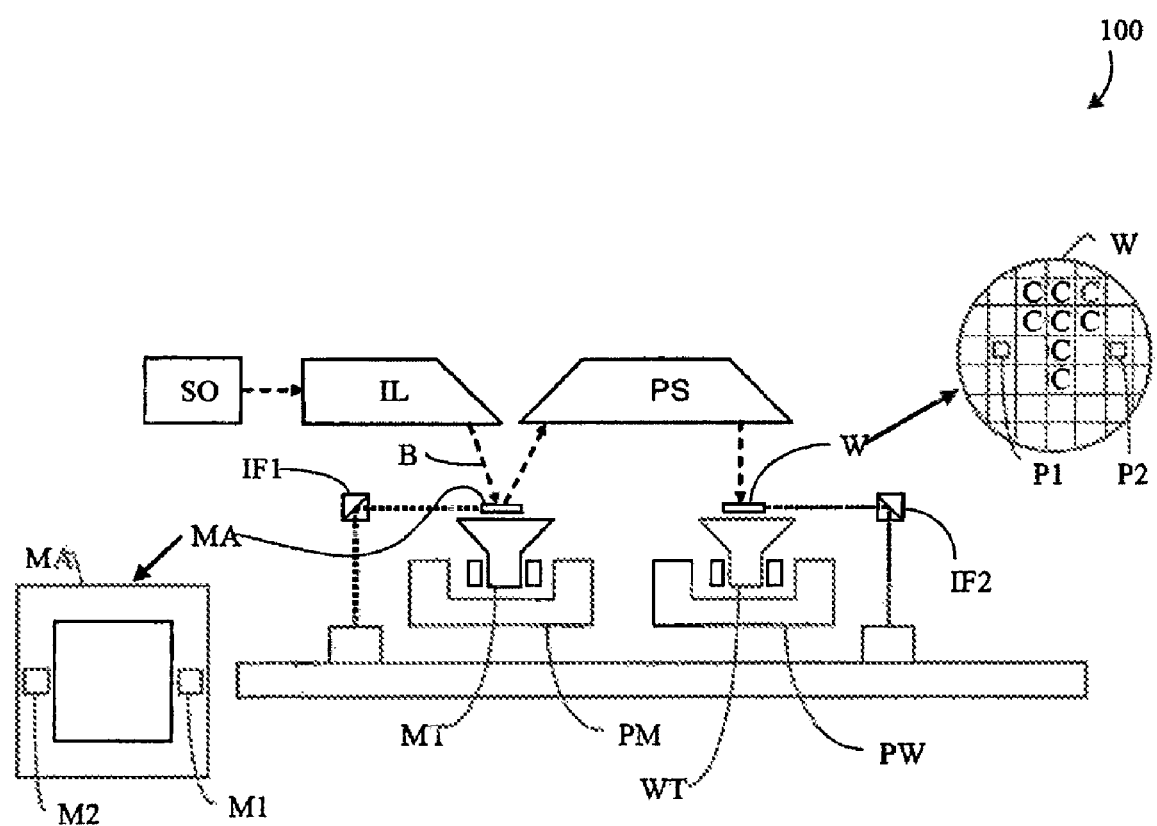
Figure 1B:
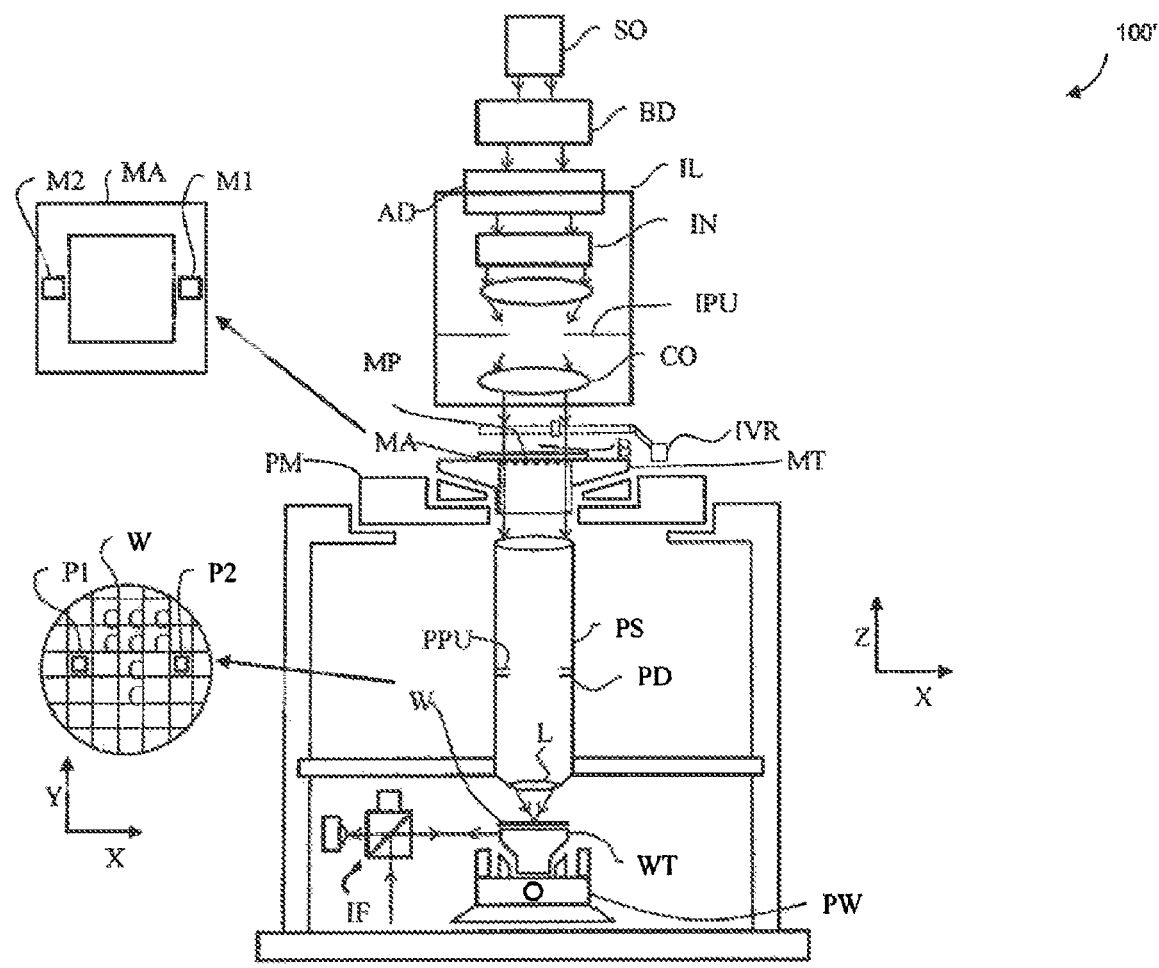

FIGS. 1A and 1B schematically depict lithographic apparatus 100 and lithographic apparatus 100', respectively. Lithographic apparatus 100 and lithographic apparatus 100' each include: an illumination system (illuminator) IL configured to condition a radiation beam B (e.g., DUV or EUV radiation); a support structure (e.g., a mask table) MT configured to support a patterning device (e.g., a mask, a reticle, or a dynamic patterning device) MA and connected to a first positioner PM configured to accurately position the patterning device MA; and a substrate table (e.g., a wafer table) WT configured to hold a substrate (e.g., a resist coated wafer) W and connected to a second positioner PW configured to accurately position the substrate W. Lithographic apparatuses 100 and 100' also have a projection system PS configured to project a pattern imparted to the radiation beam B by patterning device MA onto a target portion (e.g., including one or more dies) C of the substrate W. In lithographic apparatus 100 the patterning device MA and the projection system PS are reflective, and in lithographic apparatus 100' the patterning device MA and the projection system PS are transmissive.

The illumination system IL may include various types of optical components, such as refractive, reflective, magnetic, electromagnetic, electrostatic or other types of optical components, or any combination thereof, for directing, shaping, or controlling the radiation beam B.

The support structure MT holds the patterning device MA in a manner that depends on the orientation of the patterning device MA, the design of the lithographic apparatuses 100 and 100', and other conditions, such as for example whether or not the patterning device MA is held in a vacuum environment. The support structure MT may use mechanical, vacuum, electrostatic or other clamping techniques to hold the patterning device MA. The support structure MT may be a frame or a table, for example, which may be fixed or movable, as required. The support structure MT may ensure that the patterning device is at a desired position, for example with respect to the projection system PS.

The term "patterning device" MA should be broadly interpreted as referring to any device that may be used to impart a radiation beam B with a pattern in its cross-section, such as to create a pattern in the target portion C of the substrate W. The pattern imparted to the radiation beam B may correspond to a particular functional layer in a device being created in the target portion C, such as an integrated circuit.

The patterning device MA may be transmissive (as in lithographic apparatus 100' of FIG. 1B) or reflective (as in lithographic apparatus 100 of FIG. 1A). Examples of patterning devices MA include reticles, masks, programmable mirror arrays, and programmable LCD panels. Masks are well known in lithography, and include mask types such as binary, alternating phase shift, and attenuated phase shift, as well as various hybrid mask types. An example of a programmable mirror array employs a matrix arrangement of small mirrors, each of which may be individually tilted so as to reflect an incoming radiation beam in different directions. The tilted mirrors impart a pattern in the radiation beam B which is reflected by the mirror matrix.

The term "projection system" PS may encompass any type of projection system, including refractive, reflective, catadioptric, magnetic, electromagnetic and electrostatic optical systems, or any combination thereof, as appropriate for the exposure radiation being used, or for other factors, such as the use of an immersion liquid or the use of a vacuum. A vacuum environment may be used for EUV or electron beam radiation since other gases may absorb too much radiation or electrons. A vacuum environment may therefore be provided to the whole beam path with the aid of a vacuum wall and vacuum pumps.

Lithographic apparatus 100 and/or lithographic apparatus 100' may be of a type having two (dual stage) or more substrate tables (and/or two or more mask tables) WT. In such "multiple stage" machines the additional substrate tables WT may be used in parallel, or preparatory steps may be carried out on one or more tables while one or more other substrate tables WT are being used for exposure. When the preparatory steps can be performed while one or more other substrate tables WT are being used for exposure, the preparatory steps are said to occur during an "in-line phase" because the preparatory steps are performed within the desired throughput of the lithographic apparatus 100 and/or lithographic apparatus 100'. In contrast, when the preparatory steps cannot be performed while one or more other substrate tables WT are being used for exposure, the preparatory steps are said to occur during an "off-line phase" because the preparatory steps cannot be performed within a desired throughput of lithographic apparatus 100 and/or lithographic apparatus 100'. As described in more detail herein, focus-positioning parameters of an exposure system (such as, for example projection system PS of lithographic apparatuses 100, 100') may be determined in an off-line phase, an in-line phase, or a combination thereof.

Referring to FIGS. 1A and 1B, the illuminator IL receives a radiation beam from a radiation source SO. The source SO and the lithographic apparatuses 100, 100' may be separate entities, for example when the source SO is an excimer laser. In such cases, the source SO is not considered to form part of the lithographic apparatuses 100 or 100', and the radiation beam B passes from the source SO to the illuminator IL with the aid of a beam delivery system BD (FIG. 1B) including, for example, suitable directing mirrors and/or a beam expander. In other cases, the source SO may be an integral part of the lithographic apparatuses 100, 100'—for example when the source SO is a mercury lamp. The source SO and the illuminator IL, together with the beam delivery system BD, if required, may be referred to as a radiation system.

The illuminator IL may include an adjuster AD (FIG. 1B) for adjusting the angular intensity distribution of the radiation beam. Generally, at least the outer and/or inner radial extent (commonly referred to as σ-outer and σ-inner, respectively) of the intensity distribution in a pupil plane of the illuminator may be adjusted. In addition, the illuminator IL may include various other components (FIG. 1B), such as an integrator IN and a condenser CO. The illuminator IL may be used to condition the radiation beam B, to have a desired uniformity and intensity distribution in its cross section.

Referring to FIG. 1A, the radiation beam B is incident on the patterning device (e.g., mask) MA, which is held on the support structure (e.g., mask table) MT, and is patterned by the patterning device MA. In lithographic apparatus 100, the radiation beam B is reflected from the patterning device (e.g., mask) MA. After being reflected from the patterning device (e.g., mask) MA, the radiation beam B passes through the projection system PS, which focuses the radiation beam B onto a target portion C of the substrate W. With the aid of the second positioner PW and position sensor IF2 (e.g., an interferometric device, linear encoder or capacitive sensor), the substrate table WT may be moved accurately, e.g. so as to position different target portions C in the path of the radiation beam B. Similarly, the first positioner PM and another position sensor IF1 may be used to accurately position the patterning device (e.g., mask) MA with respect to the path of the radiation beam B. Patterning device (e.g., mask) MA and substrate W may be aligned using mask alignment marks M1, M2 and substrate alignment marks P1, P2.

Referring to FIG. 1B, the radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1B) can be used to accurately position the mask MA with respect to the path of the radiation beam B, e.g., after mechanical retrieval from a mask library, or during a scan.

In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (known as scribe-lane alignment marks). Similarly, in situations in which more than one die is provided on the mask MA, the mask alignment marks may be located between the dies.

The lithographic apparatuses 100 and 100' may be used in at least one of the following modes.

In step mode, the support structure (e.g., mask table) MT and the substrate table WT are kept essentially stationary, while an entire pattern imparted to the radiation beam B is projected onto a target portion C at one time (i.e., a single static exposure). The substrate table WT is then shifted in the X and/or Y direction so that a different target portion C may be exposed.

In scan mode, the support structure (e.g., mask table) MT and the substrate table WT are scanned synchronously while a pattern imparted to the radiation beam B is projected onto a target portion C (i.e., a single dynamic exposure). The velocity and direction of the substrate table WT relative to the support structure (e.g., mask table) MT may be determined by the (de-)magnification and image reversal characteristics of the projection system PS.

In another mode, the support structure (e.g., mask table) MT is kept substantially stationary holding a programmable patterning device, and the substrate table WT is moved or scanned while a pattern imparted to the radiation beam B is projected onto a target portion C. A pulsed radiation source SO may be employed and the programmable patterning device is updated as required after each movement of the substrate table WT or in between successive radiation pulses during a scan. This mode of operation may be readily applied to maskless lithography that utilizes programmable patterning device, such as a programmable mirror array of a type as referred to herein.

Combinations and/or variations on the described modes of use or entirely different modes of use may also be employed.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) or extreme ultraviolet radiation (e.g., having a wavelength of 5 nm or above).

The term "lens," where the context allows, may refer to any one or combination of various types of optical components, including refractive and reflective optical components.

Figure 2:
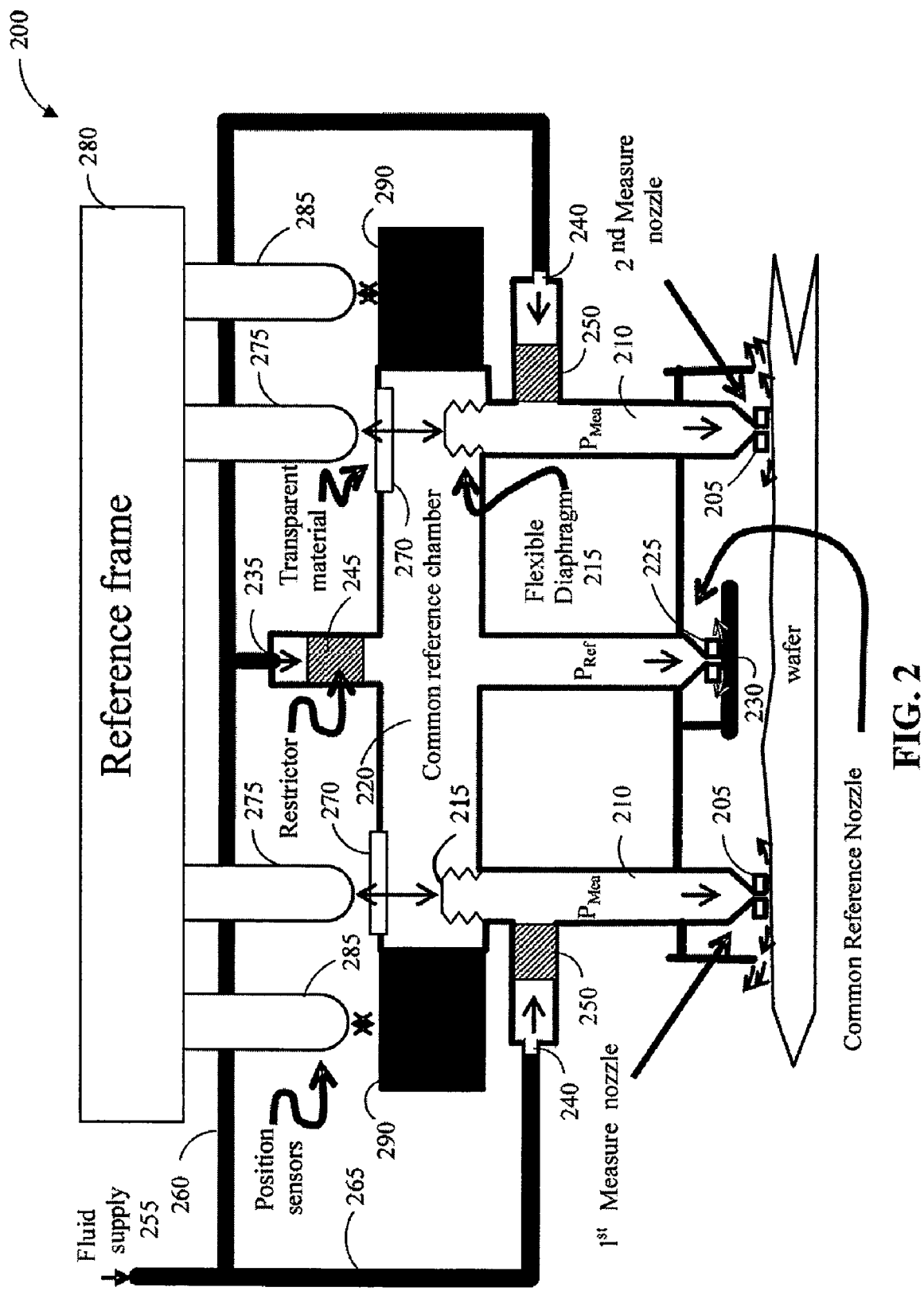
FIG. 2 is a diagram of a proximity sensor, according to an embodiment of the current invention.

FIG. 2 provides a diagram of a proximity sensor 200, in accordance with an embodiment of the current invention. Proximity sensor 200 includes one or more measurement nozzles 205, one or more measurement chambers 210, one or more diaphragms 215, a common reference chamber 220, a reference nozzle 225, a reference standoff 230, a reference input port 235, and one or more measurement input ports 240. Fluid (e.g. air) supply 255 supplies fluid to the proximity sensor 200 via the one or more measurement supply ports 240, and the reference supply port 235. Control over the fluid supply can be exercised by the optional reference restrictor 245 and the optional measurement restrictors 250, where the restrictors form a part of the respective supply ports 235 and 240, respectively.

Diaphragm(s) 215 form part of a common wall between the common reference chamber 220 and the respective measurement chamber(s) 210, and as such separate the common reference chamber 220 from the respective measurement chamber(s) 210. As such, a separate diaphragm 215 is associated with each and every measurement chamber 210. Venting of the fluid is achieved via the nozzles associated with each chamber. The ease with which the fluid is vented is dependent upon the proximity of the particular nozzle to an exterior surface, i.e., a material surface such as a wafer surface. In the case of the reference nozzle 225, a reference standoff 230 is placed adjacent and proximate to the reference nozzle 225. By adopting such a placement of the reference standoff 230, a reference pressure is established in the reference chamber 220. Pressure in each of the measurement chamber(s) 210 is established by the proximity of the respective measurement nozzle(s) 225 to an exterior surface, such as a wafer surface. The architecture is arranged such that the diaphragm(s) move as the pressure difference between the reference chamber 220 and the measurement chamber(s) varies. Such a variation in pressure is driven by the topographic changes in the surface under scrutiny by the proximity sensor 200.

The purpose of the common reference chamber is to reduce the common mode sources of error in the proximity measurement process. Common mode sources of error include variations in fluid supply pressure, variations in ambient room pressures, effects due to wind currents, and the like. For example, variations in ambient room pressures occur when a semiconductor process operator enters a clean room since the pressure in a clean room is typically maintained at a higher level to retard the entry of dust and other foreign particles from entering the clean room. Similarly, one source of wind currents in a semiconductor facility is the movement of wafer tables, which move at high speeds and thus create a bow wave.

Movement of the diaphragm(s) 215 in response to the pressure differential is measured by position sensor(s) 275. Each pressure sensor 275 outputs a signal that is responsive to the movement of its respective diaphragm 215. The position sensor(s) 275 can use a number of different means of diaphragm movement detection, including capacitive, inductive, or optical means. The position sensor(s) 275 can be isolated from the diaphragm(s) 215 within the measurement chambers 210 through the use of transparent materials, i.e. window-like in that they do not interfere with the diaphragm sensing mechanism. For example, the use of an optically transparent material would be suitable for isolation when the sensing mechanism is an optical mechanism. Similarly, a non-conductive material is suitable for isolation when the sensing mechanism is a capacitive mechanism. Finally, a low-permeability material is suitable for the "transparent material" when the sensing mechanism is an inductive mechanism.

The benefits of the above are many-fold. Firstly, the proximity sensor employs only a single common reference chamber such that only one reference gap is needed. Secondly, diaphragm surface movement detection is accomplished external to this chamber. Thirdly, if the sensor head needs to ride on a mechanism, a parallel set of sensors can detect the motion and drift of the mechanism. Additionally, the common reference chamber vents into a common shroud.

In a further embodiment of the present invention, it may be required that the proximity sensor 200 be placed on an extension-retraction mechanism. Such a mechanism offers the advantage of using the proximity sensor to measure extremely small gaps between the sensor and the surface under scrutiny. In order to ensure that the sensor accuracy is maintained despite the moving of the extension-retraction mechanism, reference surfaces 290 on the assembly can be added together with associated sensors. In this manner, the assembly-to-ground reference can be preserved despite instability and inaccuracy in the extension-retraction mechanism. Accordingly, during movement of the extension-retraction mechanism, the drift can be detected in parallel by additional sensors detecting assembly motion with respect to the reference frame.

Still referring to FIG. 2, a reference frame 280 supports one or more position sensors 275, each of which measures the movement of the associated diaphragm 215. Both the reference frame 280 and the position sensors 275 are fixed in location. The proximity sensor 200 is on a retractable mechanism (not shown), and the pneumatic lines 260 and 265 provide fluid from the fluid supply 255 to input ports 235 and 240 respectively. One or more reference position sensors 285 are affixed to the reference frame 280. These reference sensors 285 are used to measure drift and motion of the extension-retraction mechanism.

Figure 3:
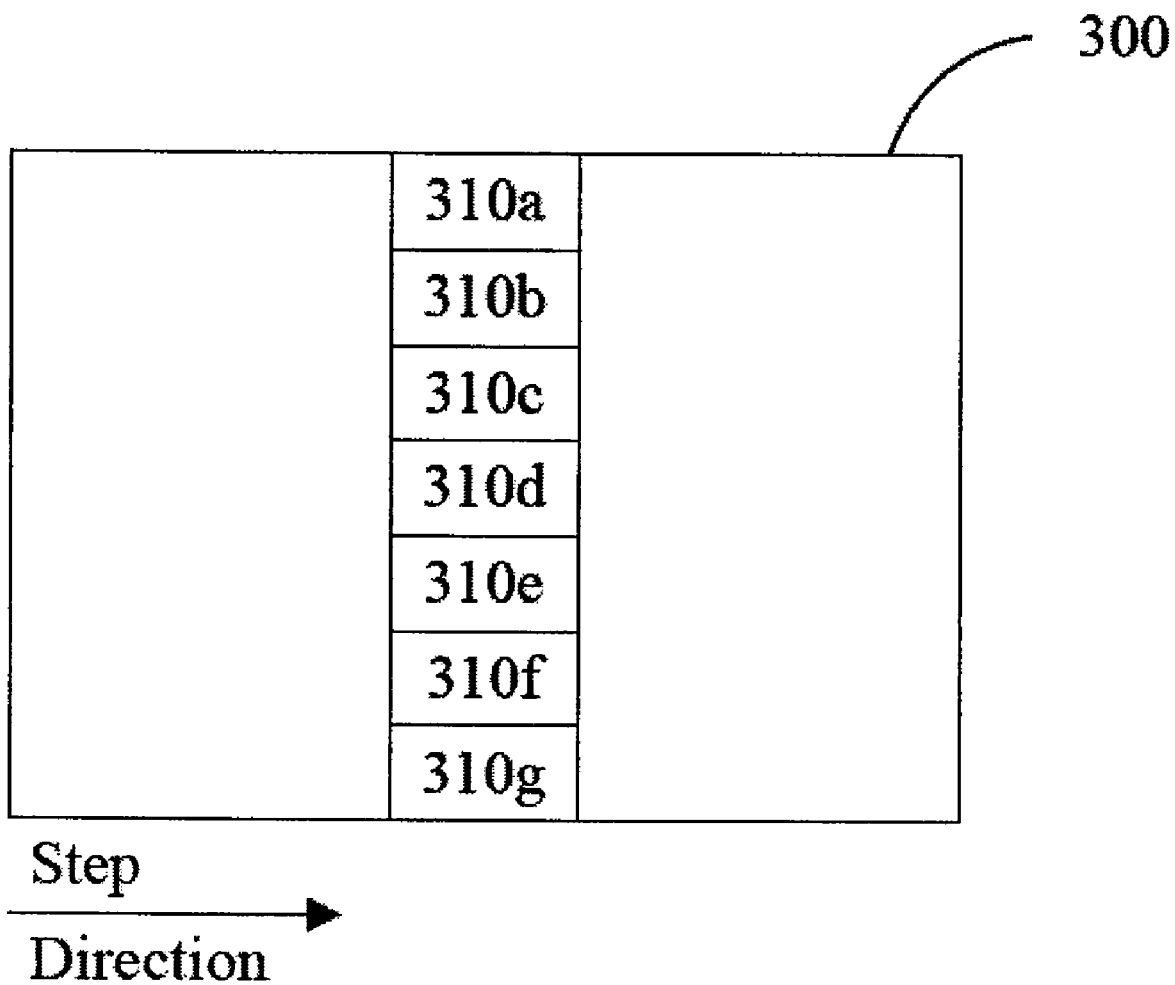
FIG. 3 illustrates the use of a proximity sensor to output multiple samples from which a topographical map for the field of exposure is generated.

As noted above, the generation of a topological map with the required accuracy is a detailed process. FIG. 3 illustrates the use of multiple samples by a proximity sensor to yield a topographical map over the field to be exposed. Referring to FIG. 3, an exposure field 300 requires a topographical map to be generated in order to support subsequent semiconductor manufacturing operations. Since proximity sensors provide localized (i.e., around a particular point) proximity information, a topographical map across an exposure field 300 requires numerous samples that are sufficient in number to adequately capture the topography of the exposure field 300.

For example, a 21 mm by 21 mm exposure field 300 could be sampled using a linear array of seven (7) sensors 310a-g (drawing not to scale), with each sensor in the array supporting a 3 mm by 2 mm footprint. In this case, the sensors are arrayed in their "long" direction (i.e., the 3 mm direction), and the footprint of the linear array thereby addresses a strip having dimensions 21 mm by 2 mm. To cover the entire exposure field, the linear array would be stepped, in 2 mm increments, across the width of the exposure field. A total of 11 steps would be required for the 2 mm wide strips to completely capture the entire 21 mm of exposure field. Therefore, a total of 77 samples would be used to capture the topographical variations of the entire exposure field. Note that FIG. 3 is not shown to scale.

In a further embodiment of the present invention, the exposure field can be scanned (as an alternative to stepping across the wafer). In such an embodiment, the proximity sensor would perform in a similar manner to that described above, but with its performance now limited by the bandwidth of the proximity sensor.

Using the sampled topographic data, analysis may be performed to yield a topographic map for the exposure field under scrutiny. While the topographic map may simply be the raw topographic data organized by location on the wafer, additional analysis can yield a three-dimensional topographic function (Z, Tx, Ty), where Z is the height at a particular (x,y) coordinate, and Tx and Ty represent the tilt in each of the x and y directions respectively. Such a three-dimensional topographic function could represent a "best fit" to the raw sampled data, and provides a means by which subsequent semiconductor processing equipment may be controlled in order to account for topographic undulations.

Since speed of topographic measurement is an important issue in semiconductor lithography, the number of proximity samples necessary to adequately capture the topography of a wafer surface is important. Where a suitably accurate three-dimensional topographic function can be generated with a reduced proximity sample set, such a situation is preferred because of speed. For example, using a larger individual sensor footprint can reduce the number of samples required, provided the reduced sample set can adequately represent the topographical information.

Figure 4:
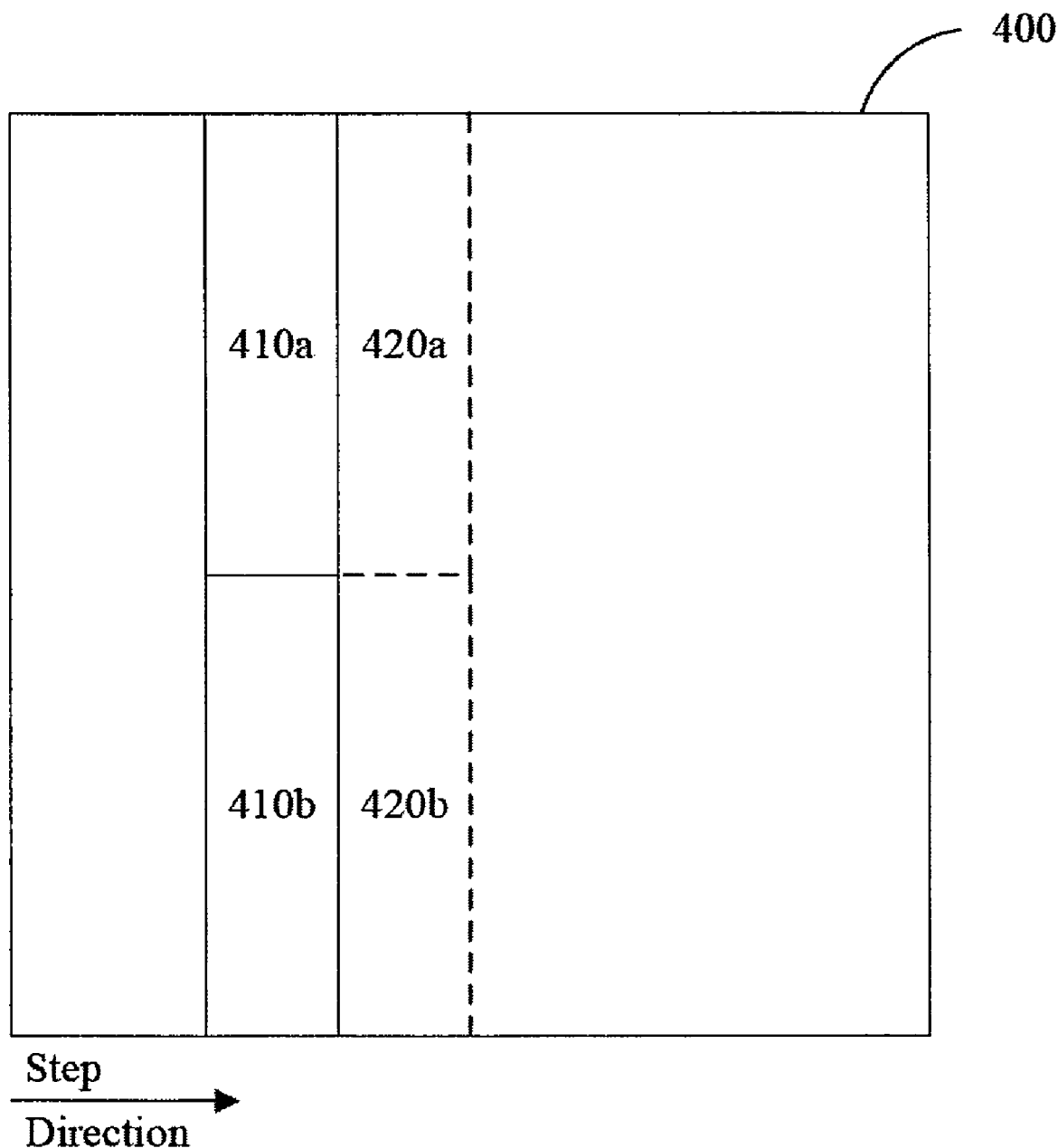
FIG. 4 illustrates the use of a reduced sample set approach by a proximity sensor to yield a topographical map over the exposure field, according to an embodiment of the current invention.

In accordance with an embodiment of the current invention, FIG. 4 illustrates the use of a reduced sample set approach by a proximity sensor to yield a topographical map over the exposure field of interest. Here, by way of illustration, each sensor is now larger in the direction of the linear array. In that particular direction, a small number of sensors are now required to create the linear array. Because the size of the sensor in the "step" direction is unchanged, the number of steps remains unchanged for a given exposure field dimensions.

For example, the sample reduction approach can be applied to the 21 mm by 21 mm square exposure field by using a linear array of two (2) sensors 410*a,b*, with each sensor in the array supporting a 10.5 mm by 2 mm footprint. In this case, the sensors would be arrayed in their "long" direction (i.e., the 10.5 mm direction), and the footprint of the linear array thereby addresses a strip having dimensions 21 mm by 2 mm. To cover the entire exposure field, the linear array would again be stepped, in 2 mm increments, across the width of the exposure field. For example, sensors 410*a,b* would be stepped to areas 420*a,b* respectively. A total of 11 steps would be required for the 2 mm wide strips to completely capture the entire 21 mm of exposure field. Therefore, a total of 22 (reduced from 77) samples would be used to capture the topographical variations of the entire exposure field in this particular example. Note that FIG. 4 is not drawn to scale.

As before, once the sampled proximity data is collected from the sensors, it can be further analyzed to yield the required (Z, Tx, Ty) three-dimensional topographic function in support of the subsequent semiconductor manufacturing operation. The acceptable sample rate (and therefore proximity sensor footprint size) in any given situation is dependent on the rapidity of topographic surface variation in the particular exposure field of interest, as well as the degree of accuracy required of the topographic information to meet the needs of the subsequent semiconductor processing step.

Thus, the cost of obtaining topographic mapping information can be decreased, either by obtaining fewer samples (using for example larger sensor footprint sizes) where accuracy permits, or where accuracy is paramount, by reducing the cost per sensor footprint.

In the latter case, the cost per sensor footprint can be lowered by reducing the measurement apparatus required to support each individual nozzle. In accordance with an embodiment of the present invention, the supporting measurement apparatus can be reduced by reducing the number of pressure detectors, yet maintaining the number and size of the nozzles so as to remain responsive to the rapid topographic depth variation. For example, multiple individual ports could be integrated into a single measurement chamber. By using control valves to multiplex the array of individual nozzles, a sampling of the proximity pattern across the exposure field of interest in a cost-effective manner.

FIG. 5 illustrates a schematic diagram whereby multiple proximity samples can be obtained over the exposure field by employing switchable multiple nozzles connected to one or more common measurement chambers, in accordance with an embodiment of the present invention. A plurality of measurement nozzles 510 are used to vent the fluid, as is the case in the nominal proximity sensor. However, instead of a direct connection between each individual measurement nozzle 510 and its associated measurement chamber, control valves 520 are used to multiplex (or switch) the fluid flow from each individual measurement nozzle 510 to one or more common measurement chambers (not shown). In one embodiment of the present invention, the control valves 520 are activated based on a determination of the maximum footprint size consistent with the minimum accuracy required to support subsequent semiconductor processing steps. As described in other embodiments of the present invention, each common measurement chamber has associated with it a position sensor that outputs a signal that is responsive to the movement of the respective diaphragm associated with the particular common measurement chamber.

More sophisticated approaches can be used to multiplex the series of measurement nozzles to the one or more common measurement chambers. For example, in a further embodiment, control valves could be used to send one half of the nozzles to one common measurement chamber, while the other half of the nozzles would be sent to a second common measurement chamber. In such a multiplexing configuration, the resulting Z topographic measurement from a pair of such measurements would be the average of the two measurements, while the rotation would be the difference between the two measurements. In a still further embodiment, the rotation could be measured by placing a diaphragm between the two common measurement chambers, rather than using two separate diaphragms that each separate a common measurement from the reference chamber.

As noted above, the cost of obtaining topographic mapping information can be decreased by obtaining fewer samples (using for example larger sensor footprint sizes) where accuracy permits. In yet another embodiment of the present invention, a cost effective proximity sensor can be achieved by permitting variation in the nozzle aperture connected to each measurement chamber. For example, the length or width of an aperture could be adjusted in order to optimize the aperture size for a given accuracy requirement. As the aperture size is adjusted, the net fluid flow to the aperture would also be adjusted to accommodate the changing restriction of the nozzles involved.

FIGS. 6A and 6B illustrate approaches whereby adjustable nozzles can be used to optimize the sensor footprint in view of the topographic accuracy requirement. An adjustable nozzle 610 is shown, together with movable elements that may be used to change the size of the nozzle. FIG. 6A shows movable elements 620 that are used to reduce the longer dimension of the adjustable nozzle 610. FIG. 6B shows a movable element 630 that is used to reduce the dimension of the adjustable nozzle 610. The movable elements 620 and 630 may be moved by any mechanism sufficient to provide the agility required in a modern semiconductor processing environment. Thus, electric, piezoelectric, electromagnetic, pneumatic, or the like, mechanisms are within the scope of the current invention.

In summary, the embodiments shown in FIGS. 5 and 6 illustrate means by which the cost per sensor footprint may be lowered by reducing the sensor apparatus required. Despite such cost reductions, these embodiments nevertheless deliver the required data information (i.e. (Z,Ty)) at each measurement point while stepping (or scanning) in the x-direction across the exposure field of interest.

FIG. 7 provides a flowchart of a method 700 that uses fluid flow through one or more adjustable nozzles to perform proximity measurements on a material surface.

The process begins at step 710. In step 710, a fluid proximity sensor nozzle is placed close to the material surface being measured.

In step 720, the size of the fluid proximity sensor nozzle is adjusted to support an accuracy requirement for a local area of the material surface being measured.

In step 730, a proximity measurement is made using the adjusted nozzle.

Steps 720 and 730 are repeated across the local area of the material surface for which a topographic map is required to support the subsequent semiconductor processing steps. The proximity measurements are used to create a database of surface undulations as a function of the surface coordinate at each location. Optionally, analysis may be applied to the proximity data to create a functional relationship of the form (Z, Tx, Ty), as described earlier.

At step 740, method 700 ends.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. An apparatus, comprising:
    a plurality of measurement chambers having first supply ports and measurement nozzles, wherein each of the plurality of measurement chambers is configured to receive fluid via the first supply port and to vent the fluid via the measurement nozzle;
    a reference chamber having a second supply port, a reference nozzle, and a reference surface, wherein the reference chamber is common to the plurality of measurement chambers, and is configured to receive fluid via the second supply port and to vent the fluid via the reference nozzle;
    a diaphragm forming a portion of a common wall of each of the plurality of measurement chambers and the reference chamber, and separating the reference chamber from each of the plurality of measurement chambers, wherein the diaphragm is responsive to pressure applied thereto;
    a reference standoff surface attached to the reference chamber, and located proximately opposite from the reference nozzle;
    a reference frame located external to the reference chamber;
    a position sensor attached to the reference frame, and configured to output a signal responsive to movement of the diaphragm; and
    a reference position sensor attached to the reference frame, and configured to output a signal responsive to movement of the reference surface.

2. The apparatus of claim 1, wherein the first supply port and the second supply port each comprise a restrictor.

3. The apparatus of claim 1, wherein the reference chamber further comprises a window configured to permit the position sensor to detect movement of the diaphragm from a location external to the reference chamber.

4. The apparatus of claim 1, wherein the position sensor is an optical sensor, and the window in the reference chamber comprises a transparent material.

5. The apparatus of claim 1, wherein the position sensor is a capacitive sensor, and the window in the reference chamber comprises a non-conductive material.

6. The apparatus of claim 1, wherein the position sensor is an inductive sensor, and the window comprises a low-permeability material.

7. The apparatus of claim 1, wherein the measurement nozzle is an adjustable measurement nozzle.

8. The apparatus of claim 7, wherein the adjustable measurement nozzle is a substantially rectangular opening having a length and a width, wherein the length is adjusted by a movable element.

9. The apparatus of claim 7, wherein the adjustable measurement nozzle is a substantially rectangular opening having a length and a width, and wherein the area of the substantially rectangular opening is adjusted by a movable element.

10. The apparatus of claim 1, further comprising:
    wherein each measurement nozzle of the plurality of measurement chambers comprises multiple measurement nozzles, and wherein:
        each measurement chamber is a common measurement chamber to the multiple measurement nozzles;
        the common measurement chamber being configured to receive the fluid from a fluid supply; and
        the multiple measurement nozzles being grouped into at least a first group and a second group;

a pressure detector configured to output a signal that is responsive to a pressure difference between the common measurement chamber and the common reference chamber; and a pair of control valves configured to switchably couple either the first group of measurement nozzles or the second group of measurement nozzles to the common measurement chamber such that fluid is vented via the coupled group of measurement nozzles.

11. A lithographic system, comprising:
an illumination system configured to produce a beam of radiation;
a support device configured to support a patterning device that is capable of patterning the beam of radiation;
a projection system configured to project the patterned beam onto a substrate; and
a proximity sensor configured to measure proximity from the substrate comprising:
  a plurality of measurement chambers having a first supply ports and a measurement nozzles, wherein each of the plurality of measurement chambers is configured to receive fluid via the first supply port and to vent the fluid via the measurement nozzle;
  a reference chamber having a second supply port, a reference nozzle, and a reference surface, wherein the reference chamber is common to the plurality of measurement chambers, and is configured to receive fluid via the second supply port and to vent the fluid via the reference nozzle;
  a diaphragm forming a portion of a common wall of each of the plurality of measurement chambers and the reference chamber, and separating the reference chamber from each of the plurality of measurement chambers, wherein the diaphragm is responsive to pressure applied thereto;
  a reference standoff surface attached to the reference chamber and located proximately opposite from the reference nozzle;
  a reference frame located external to the reference chamber;
  a position sensor attached, to the reference frame, and configured to output a signal responsive to movement of the diaphragm; and
  a reference position sensor attached to the reference frame, and configured to output a signal responsive to movement of the reference surface.

12. The lithographic system of claim 11, wherein the reference chamber further comprises a window configured to permit the position sensor to detect movement of the diaphragm from a location external to the reference chamber.

13. The lithographic system of claim 11, wherein the position sensor is an optical sensor, and the window comprises a transparent material.

14. The lithographic system of claim 11, wherein the position sensor is a capacitive sensor, and the window comprises a non-conductive material.

15. A method comprising:
receiving fluid via a first supply ports of a plurality of measurement chambers to vent the fluid via measurement nozzles of the plurality of measurement chambers;
receiving fluid via a second supply port of a reference chamber to vent the fluid via a reference nozzle of the reference chamber, wherein the reference chamber is common to the plurality of measurement chambers, and a reference standoff surface is attached to the reference chamber and located proximately opposite from the reference nozzle;
separating the reference chamber from each of the plurality of measurement chambers by a common wall having a portion with a diaphragm that is responsive to pressure applied thereto;
supporting a position sensor and a reference sensor on a reference frame located external to the reference chamber;
outputting a signal responsive to movement of the diaphragm using the position sensor; and
outputting a signal responsive to movement of a reference surface, attached to the reference chamber using the reference sensor.

16. The method of claim 15, further comprising providing a restrictor in the first supply port and the second supply port.

17. The method of claim 15, further comprising providing a window in the reference chamber, wherein the window is configured to permit the position sensor to detect movement of the diaphragm from a location external to the reference chamber.

18. The method of claim 17, further comprising using the position sensor to output a signal responsive to the detected movement of the diaphragm.

19. The method of claim 15, wherein the position sensor is an optical sensor, and the window in the reference chamber comprises a transparent material.

20. The method of claim 15, wherein the position sensor is a capacitive sensor, and the window in the reference chamber comprises a non-conductive material.

21. The method of claim 15, wherein the position sensor is an inductive sensor, and the window in the reference chamber comprises a low-permeability material.

22. The method of claim 15, further comprising sensing a distance between a manufacturing tool and a material surface being worked upon in a semiconductor lithography apparatus based on the output signal of the position sensor.

23. The method of claim 15, wherein the measurement nozzle is an adjustable measurement nozzle.

24. The method of claim 23, wherein the adjustable measurement nozzle is a substantially rectangular opening having a length and a width, wherein the length is adjusted by a movable element.

25. The method of claim 23, wherein the adjustable measurement nozzle is a substantially rectangular opening having a length and a width, and wherein the area of the substantially rectangular opening is adjusted by a movable element.

26. The method of claim 15, further comprising:
receiving fluid via first supply ports of the plurality of, measurement chambers to vent the fluid via a plurality of measurement nozzles in the measurement nozzle of each of the plurality of measurement chambers that is a common measurement chamber, wherein the plurality of measurement nozzles is grouped into at least a first group and a second group,
outputting a signal that is responsive to a pressure difference between the common measurement chamber and the common reference chamber using a pressure detector; and
providing a pair of control valves to switchably couple either the first group of measurement nozzles or the second group of measurement nozzles to the common measurement chamber such that fluid is vented via the coupled group of measurement nozzles.

* * * * *

UNITED STATES PATENT AND TRADEMARK OFFICE
CERTIFICATE OF CORRECTION

PATENT NO. : 8,390,782 B2  
APPLICATION NO. : 12/539190  
DATED : March 5, 2013  
INVENTOR(S) : Joseph H. Lyons Page 1 of 1

It is certified that error appears in the above-identified patent and that said Letters Patent is hereby corrected as shown below:

In the Claims:

In column 13, line 19, claim 11, after "having" please delete "a".
In column 13, line 20, claim 11, after "and" please delete "a".

Signed and Sealed this
Twenty-first Day of May, 2013

Teresa Stanek Rea
*Acting Director of the United States Patent and Trademark Office*